(12) United States Patent
Shimizu et al.

(10) Patent No.: US 7,081,998 B2
(45) Date of Patent: Jul. 25, 2006

(54) SOLID-STATE IMAGING APPARATUS

(75) Inventors: Ryu Shimizu, Mizuho (JP); Mitsuru Okigawa, Nagoya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/966,068

(22) Filed: Oct. 18, 2004

(65) Prior Publication Data

US 2005/0088753 A1   Apr. 28, 2005

(30) Foreign Application Priority Data

Oct. 23, 2003   (JP) .............................. 2003-363528

(51) Int. Cl.
*G02B 27/10*   (2006.01)

(52) U.S. Cl. ...................... 359/619; 359/626; 359/634; 257/432; 250/208.6

(58) Field of Classification Search ................ 359/619, 359/626, 628, 634; 257/232, 432; 250/208.1, 250/208.6
See application file for complete search history.

(56) References Cited

U.S. PATENT DOCUMENTS 5,796,154 A * 8/1998 Sano et al. ................. 257/432
6,221,687 B1   4/2001 Abramovich

FOREIGN PATENT DOCUMENTS

| JP | 6-104414 | 4/1994 |
| JP | 9-64325 | 3/1997 |
| JP | 2000-164839 | 6/2000 |
| KR | 1020030042305 A | 5/2003 |

* cited by examiner

*Primary Examiner*—Hung Xuan Dang
*Assistant Examiner*—Joseph Martinez
(74) *Attorney, Agent, or Firm*—McDermott Will & Emery LLP

(57) ABSTRACT

A solid-state imaging apparatus allowing miniaturization in a structure having a lens provided between a substrate and a color filter layer is provided. This solid-state imaging apparatus comprises a photodetection part formed on the substrate, the color filter layer formed on the substrate and the lens formed between the substrate and the color filter layer for concentrating light on the photodetection part. The lens has an upwardly projecting upper surface portion, while the upper end of the upper surface portion substantially comes into contact with the lower surface of the color filter layer.

19 Claims, 13 Drawing Sheets

AREA OF ARRANGEMENT A
AREA OF ARRANGEMENT B

SOLID-STATE IMAGING APPARATUS

BACKGROUND OF THE INVENTION

1. Field of the Invention

The present invention relates to a solid-state imaging apparatus, and more particularly, it relates to a solid-state imaging apparatus comprising lenses for condensing light on photodetection parts having a photoelectric conversion function.

2. Description of the Background Art

A solid-state imaging apparatus comprising lenses for condensing light on photodetection parts having a photoelectric conversion function is known in general, as disclosed in Japanese Patent Laying-Open No. 6-104414 (1994), for example.

FIG. 27 is a sectional view showing the structure of a conventional solid-state imaging apparatus 102 comprising lenses for condensing light on photodetection parts disclosed in the aforementioned Japanese Patent Laying-Open No. 6-104414. Referring to FIG. 27, the conventional solid-state imaging apparatus 102 comprises a substrate 104. A plurality of photodetection parts 105 having a photoelectric conversion function of converting incident light to charge signals are formed on the surface of the substrate 104 at prescribed intervals. A passivation layer 106 having a flat upper surface is formed on the substrate 104. A plurality of lenses 107 having upwardly projecting upper surface portions 107a for condensing light on the photodetection parts 105 are formed on the passivation layer 106 at prescribed intervals. The lenses 107 are so arranged that lens centers 107d thereof coincide with the centers of the photodetection parts 105. A flattened layer 108 is formed to fill up the clearances between adjacent pairs of the lenses 107 while covering the upper surface portions 107a of the lenses 107. A color filter layer 109 is formed on the flattened layer 108. The lenses 107 arranged between the color filter layer 109 and the substrate 104 in the aforementioned manner are referred to as inner lenses or the like, dissimilarly to microlenses formed on the color filter layer 109. A plurality of microlenses 111 are formed on the color filter layer 109 through the flattened layer 110 at prescribed intervals.

In the conventional solid-state imaging apparatus 102 shown in FIG. 27 having the color filter layer 109 formed on the upper surface portions 107a of the lenses 107 through the flattened layer 108, however, the vertical dimension of the solid-state imaging apparatus 102 is disadvantageously increased due to the thickness of the flattened layer 108 located between the upper surface portions 107a of the lenses 107 and the lower surface of the color filter layer 109. Thus, the conventional solid-state imaging apparatus 102 having the lenses 107 provided between the substrate 104 and the color filter layer 109 is disadvantageously difficult to miniaturize.

SUMMARY OF THE INVENTION

The present invention has been proposed in order to solve the aforementioned problem, and an object of the present invention is to provide a solid-state imaging apparatus allowing miniaturization in a structure having a lens provided between a substrate and a color filter layer.

In order to attain the aforementioned object, a solid-state imaging apparatus according to an aspect of the present invention comprises a photodetection part formed on a substrate, a color filter layer formed on the substrate and a lens formed between the substrate and the color filter layer for condensing light on the photodetection part. The lens has an upwardly projecting upper surface portion, while the upper end of the upper surface portion substantially comes into contact with the lower surface of the color filter layer.

In the solid-state imaging apparatus according to this aspect, as hereinabove described, the lens for condensing light on the photodetection part is formed between the substrate and the color filter so that the upper end of the upper surface portion thereof substantially comes into contact with the lower surface of the color filter layer, whereby the distance between the upper end of the upper surface portion of the lens and the lower surface of the color filter layer can be substantially zeroed for reducing the vertical dimension of the solid-state imaging apparatus. Thus, the solid-state imaging apparatus having the lens provided between the substrate and the color filter layer can be miniaturized.

The solid-state imaging apparatus according to the aforementioned aspect preferably further comprises a resin layer, formed to cover a region of the upper surface portion of the lens other than the upper end, having a substantially flat upper surface portion substantially flush with the upper end of the upper surface portion of the lens. The color filter layer is preferably formed on the upper end of the upper surface portion of the lens and the upper surface portion of the resin layer. According to this structure, the color filter layer, which can be formed on a substantially flat surface formed by the upper end of the upper surface portion of the lens and the upper surface portion of the resin layer, can be easily formed on the lens having the upwardly projecting upper surface portion. In this case, the resin layer may consist of a material containing acrylic resin. Further, the color filter layer may consist of a resin material.

In the solid-state imaging apparatus according to the aforementioned aspect, the upper end of the upper surface portion of the lens preferably includes a substantially flat upper end surface portion substantially coming into contact with the lower surface of the color filter layer. According to this structure, a surface including the upper end of the upper surface portion of the lens formed with the color filter layer can be so easily flattened that the color filter layer can be easily formed on the lens having the upwardly projecting upper surface portion.

In the solid-state imaging apparatus according to the aforementioned aspect, the upper surface portion of the lens preferably includes an upper end having no substantially flat portion, and the upper end of the upper surface portion preferably substantially comes into contact with the lower surface of the color filter layer. According to this structure, the distance between the upper end of the upper surface portion of the lens and the lower surface of the lens can be substantially zeroed when the upper surface portion of the lens has the upper end having no substantially flat portion. Thus, the vertical dimension of the solid-state imaging apparatus can be reduced also when the upper surface portion of the lens has the upper end having no substantially flat portion.

In the solid-state imaging apparatus according to the aforementioned aspect, the lens center of the lens is arranged to deviate from the center of the photodetection part by a prescribed distance. According to this structure, the solid-state imaging apparatus can effectively condense obliquely incident light on the photodetection part by regulating the deviation between the lens center and the center of the photodetection part for focusing the light obliquely incident upon the lens on the photodetection part. When a photodetection region is formed on the substrate by a plurality of photodetection parts, therefore, condensation efficiency of the lens on the photodetection parts can be improved also in the vicinity of an end of the photodetection region receiving a larger quantity of oblique light as compared with the vicinity of the central portion, whereby the solid-state imaging apparatus having the lens provided between the substrate and the color filter layer can be improved in photosensitivity.

The solid-state imaging apparatus according to the aforementioned aspect preferably further comprises a screen member formed on a region between two adjacent photodetection parts and between the substrate and the lens, while the lower end of the lens is preferably arranged above the upper end of the screen member. According to this structure, the transverse position for arranging the lens is not limited by the screen member, whereby the lens center of the lens can be easily arranged to deviate from the center of the photodetection part by a prescribed distance. In this case, the screen member may consist of a material containing Al. Alternatively, the screen member may consist of a material containing W.

In the aforementioned structure including the screen member, the solid-state imaging apparatus preferably further comprises a flattened layer having a substantially flat upper surface at least flush with the upper end of the screen member, and the lens is preferably formed on the upper surface of the flattened layer. According to this structure, the lens can be arranged on an arbitrary position of the upper surface of the flattened layer, whereby the lens center of the lens can be arranged to deviate from the center of the photodetection part by a prescribed distance.

In the aforementioned structure including the flattened layer, the flattened layer is preferably formed to cover the screen member. According to this structure, the lens center of the lens can be easily arranged to deviate from the center of the photodetection part by a prescribed distance in the solid-state imaging apparatus having the flattened layer formed to cover the screen member, whereby the photosensitivity of the solid-state imaging apparatus can be improved.

In the aforementioned structure including the flattened layer, the flattened layer is preferably formed to cover the side surfaces and the lower surface of the screen member, and the upper end of the screen member and the upper surface of the flattened layer are preferably substantially flush with each other. According to this structure, the height of the upper surface of the flattened layer can be reduced as compared with a flattened layer formed to cover the overall screen member, whereby the lens center of the lens can be arranged to deviate from the center of the photodetection part by a prescribed distance while further reducing the vertical dimension of the solid-state imaging apparatus. Thus, the solid-state imaging apparatus can be further miniaturized and improved in photosensitivity.

In the aforementioned structure including the screen member, the solid-state imaging apparatus preferably further comprises a transfer gate for transferring a charge signal obtained in the photodetection part, and the screen member is preferably provided to cover the upper portion of the transfer gate. According to this structure, the screen member can easily inhibit the transfer gate from incidence of light.

The solid-state imaging apparatus according to the aforementioned aspect preferably further comprises a photodetection region formed on the substrate by a plurality of photodetection parts, while a plurality of lenses are preferably provided in correspondence to the plurality of photodetection parts respectively and deviation between the lens center of the lens located in the vicinity of an end of the photodetection region and the center of the corresponding photodetection part is preferably larger than deviation between the lens center of the lens located in the vicinity of the center of the photodetection region and the center of the corresponding photodetection part. According to this structure, the solid-state imaging apparatus can effectively condense light further obliquely incident in the vicinity of the end of the photodetection region as compared with the vicinity of the center of the photodetection region while condensing approximately perpendicular light in the vicinity of the center of the photodetection region. Thus, the solid-state imaging apparatus can improve condensation efficiency on the photodetection parts both in the vicinity of the center of the photodetection region and in the vicinity of the end of the photodetection region.

The solid-state imaging apparatus according to the aforementioned aspect preferably further comprises a photodetection region formed on the substrate by a plurality of photodetection parts, while deviation between the lens center of the lens and the center of the corresponding photodetection part is gradually increased from the vicinity of the center of the photodetection region toward an end of the photodetection region along the direction of arrangement of the plurality of photodetection parts. According to this structure, light having an incidence angle gradually increased from the vicinity of the center of the photodetection region toward the vicinity of the photodetection region along the direction of arrangement of the plurality of photodetection parts can be efficiently condensed on the photodetection parts in response to the incidence angle. Thus, the solid-state imaging apparatus can improve condensation efficiency on the photodetection parts over the entire photodetection region including the vicinity of the center thereof and the vicinity of the end thereof.

In this case, deviation between the lens center of the lens and the center of the corresponding photodetection part is preferably expressed as follows:

$$a \times h/L$$

assuming that L represents the distance between the photodetection parts and an exit pupil, h represents an arbitrary distance larger than the distance between the vertical position of the upper surfaces of the photodetection parts and the vertical position of the boundary between two adjacent lenses and smaller than the distance between the vertical position of the upper surfaces of the photodetection parts and the vertical position of the lens center of the lens and a represents the distance between the center of an arbitrary photodetection part in the photodetection region and the center of the photodetection region. According to this structure, light having an incidence angle gradually increased from the vicinity of the center of the photodetection region toward the vicinity of an end of the photodetection region along the direction of arrangement of the plurality of photodetection parts can be efficiently condensed on the photodetection parts through the lens in response to the incidence angle.

The solid-state imaging apparatus according to the aforementioned aspect is preferably provided with a plurality of lenses, and the plurality of lenses preferably include portions consisting of a continuous layer. According to this structure, adjacent pairs of the lenses are inhibited from forming clearances therebetween, whereby no uncondensed light results from clearances formed between adjacent lenses also when the lens centers of the plurality of lenses are arranged to remarkably deviate from the centers of the corresponding photodetection parts in response to incident light remarkably inclined in the oblique direction, dissimilarly to a case of discontinuously arranging a plurality of lenses at prescribed intervals (clearances). Thus, the solid-state imaging apparatus can suppress reduction of condensation efficiency on the photodetection part also when arranging the lens centers of the plurality of lenses to remarkably deviate from the centers of the corresponding photodetection parts for condensing incident light remarkably inclined in the oblique direction on the photodetection parts.

In the solid-state imaging apparatus according to the aforementioned aspect, the lens may consist of a material containing SiN.

The solid-state imaging apparatus according to the aforementioned aspect preferably further comprises an optical lens provided on the color filter layer. According to this structure, the solid-state imaging apparatus can further improve the condensation efficiency with the optical lens provided on the color filter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

The structure of a solid-state imaging apparatus 60 according to a first embodiment of the present invention is described with reference to FIGS. 1 to 4.

Figure 1:
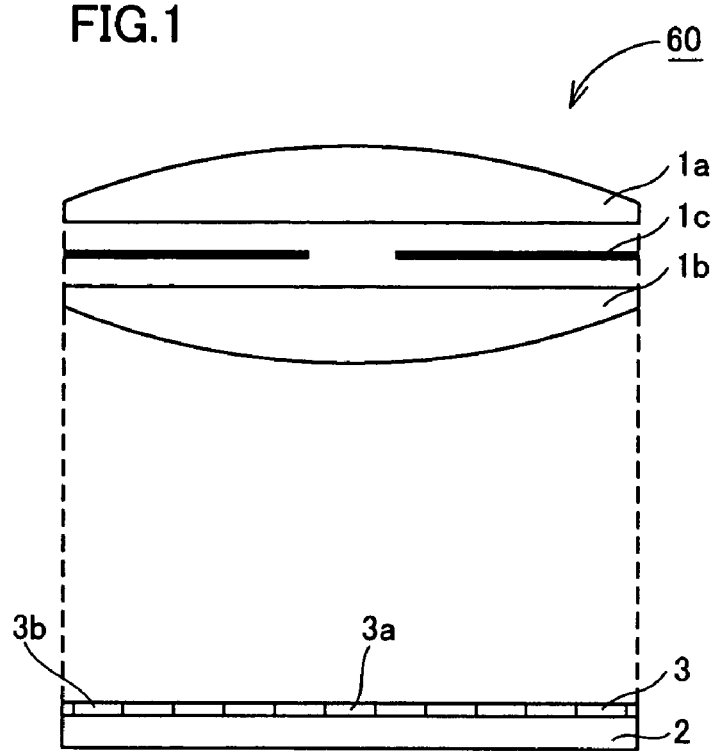
FIG. 1 is a schematic diagram showing the overall structure of a solid-state imaging apparatus according to a first embodiment of the present invention.

As shown in FIG. 1, the solid-state imaging apparatus 60 according to the first embodiment of the present invention comprises two optical lenses 1a and 1b, an aperture stop 1c and a solid-state image sensor 2. The solid-state image sensor 2, the two optical lenses 1a and 1b and the aperture stop 1c are arranged at prescribed intervals respectively. The optical lenses 1a and 1b are provided for condensing reflected light from an object. The aperture stop 1c is arranged between the optical lenses 1a and 1b. Thus, light is incident upon the optical lens 1b from the optical lens 1a through an aperture of the aperture stop 1c.

Figure 2:
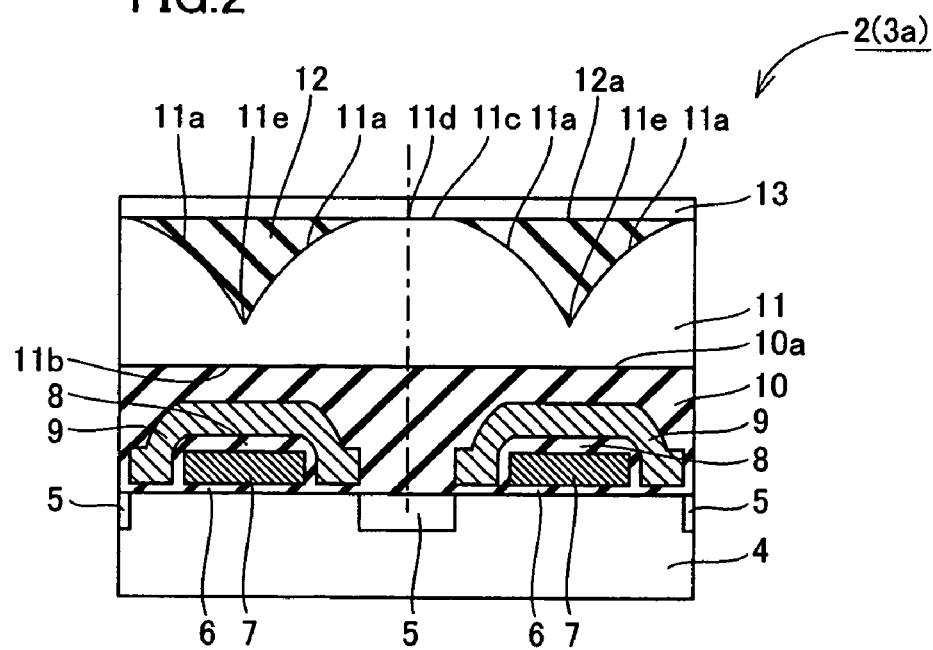
FIG. 2 is a sectional view showing a pixel portion at the center of a photodetection region of the solid-state imaging apparatus according to the first embodiment shown in FIG. 1.
Figure 3:
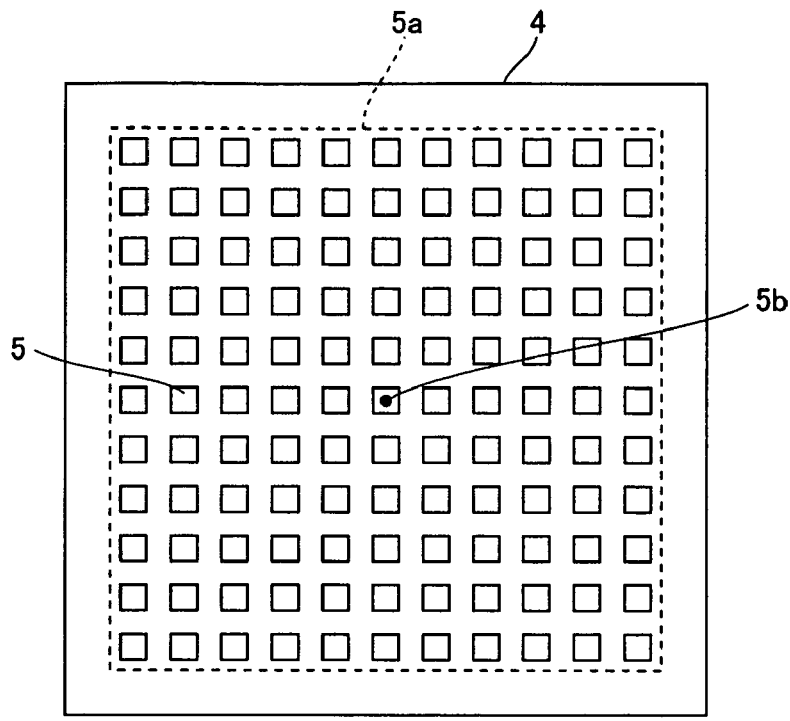
FIG. 3 is a schematic diagram for illustrating the structure of the photodetection region of the solid-state imaging apparatus according to the first embodiment shown in FIG. 1.

The solid-state image sensor 2 has the structure of an interline CCD (charge-coupled device). More specifically, the solid-state image sensor 2 includes a plurality of pixels 3. The pixels 3 of the solid-state image sensor 2 are formed with photodetection parts 5 having a photoelectric conversion function of converting incident light to charge signals on prescribed regions of the surface of a semiconductor substrate 4, as shown in FIG. 2. The semiconductor substrate 4 is an example of the "substrate" in the present invention. The photodetection parts 3 are arranged at prescribed intervals of about 2 μm to about 5 μm in one-to-one correspondence to the pixels 3. The plurality of photodetection parts 5 form a photodetection region 5a on the surface of the semiconductor substrate 4, as shown in FIG. 3. Transfer gates 7 for transferring the charge signals obtained in the photodetection parts 5 are provided on the surface of the semiconductor substrate 4 through insulator films 6, as shown in FIG. 2. The transfer gates 7 are made of polysilicon. Screen members 9 of a metal such as Al are formed to cover upper portions of the transfer gates 7 through insulator films 8. The screen members 9 are provided on regions between adjacent pairs of photodetection parts 5 above the photodetection region 5a (see FIG. 3). The screen members 9 have a function of preventing the transfer gates 7 from incidence of light.

According to the first embodiment, a flattened layer 10 of silicon oxide having a flat upper surface 10a is formed to cover the screen members 9 and the transfer gates 7. The upper surface 10a of this flattened layer 10 is formed on a vertical position of about 100 nm to about 800 nm from the upper ends of the screen members 9. A plurality of lenses 11 of SiN are formed on the upper surface 10a of the flattened layer 10 for condensing light on the photodetection parts 5. The lenses 11 have upwardly projecting upper surface portions 11a and flat lower surface portions 11b coming into contact with the upper surface 10a of the flattened layer 10 respectively. The upper surface portions 11a of the lenses 11 include flattened upper end surface portions 11c. The lenses 11 have a thickness of about 500 nm to about 800 nm at lens centers 11d and a thickness of about 50 nm to about 200 nm on boundaries 11e between the projections of the adjacent pairs of the lenses 11. A resin layer 12 of acrylic resin is formed to fill up the boundaries 11e between the adjacent pairs of the lenses 11 while covering regions of the upper surface portions 11a of the lenses 11 other than the upper end surface portions 11c. This resin layer 12 has a flattened upper surface portion 12a flush with the upper end surface portions 11c of the lenses 11. A color filter layer 13 having a thickness of about 300 nm to about 1000 nm is formed on a flat surface formed by the upper surface portion 12a of the resin layer 12 and the upper end surface portions 11c of the lenses 11. Thus, the upper end surface portions 11c of the upper surface portions 11a of the lenses 11 are in contact with the lower surface of the color filter layer 13. According to the first embodiment, the lenses 11 are arranged between the color filter layer 13 and the semiconductor substrate 4 in the aforementioned manner as inner lenses. The color filter layer 13 is made of a photosensitive resin material containing pigments of three colors of R (red), G (green) and B (blue).

Figure 4:
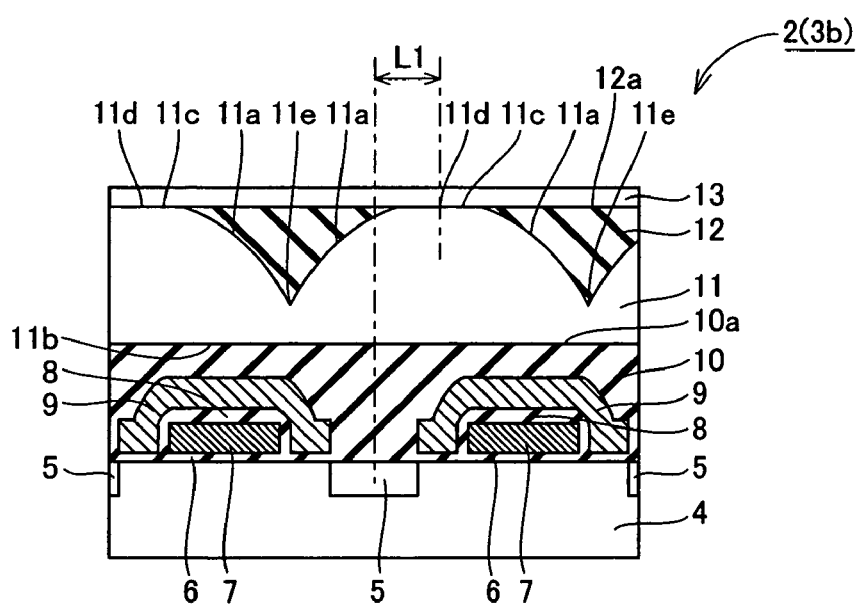
FIG. 4 is a sectional view showing the structure of another pixel portion in the vicinity of an end of the photodetection region of the solid-state imaging apparatus according to the first embodiment shown in FIG. 1.

According to the first embodiment, each pixel 3a located at the center the photodetection region 5a (see FIG. 3) is so arranged that the lens center 11d of the corresponding lens 11 and the center of the corresponding photodetection part 5 coincide with each other, as shown in FIG. 2. On the other hand, each pixel 3b located in the vicinity of each end of the photodetection region 5a (see FIG. 3) is so arranged that the lens center 11d of the corresponding lens 11 deviates from the center of the corresponding photodetection part 5 by a prescribed distance L1, as shown in FIG. 4. The deviation between the lens centers 11d of the lenses 11 and the centers of the photodetection parts 5 is gradually increased from the vicinity of the central portion of the photodetection region 5a (see FIG. 3) toward the vicinity of the ends of the photodetection region 5a along the direction of arrangement of the plurality of photodetection parts 5. At an intermediate portion between the central portion and each end of the photodetection region 5a, therefore, each pixel 3 is so set that the deviation between the lens center 11d of the corresponding lens 11 and the center of the corresponding photodetection part 5 is at an intermediate level between the deviation (0: see FIG. 2) at the central portion of the photodetection region 5a and the deviation (L1: see FIG. 4) in the vicinity of each end of the photodetection region 5a.

In all areas of the photodetection region 5a, the deviation between the lens centers 11d of the lenses 11 and the centers of the corresponding photodetection parts 5 is set to not more than about 500 nm.

Figure 5:
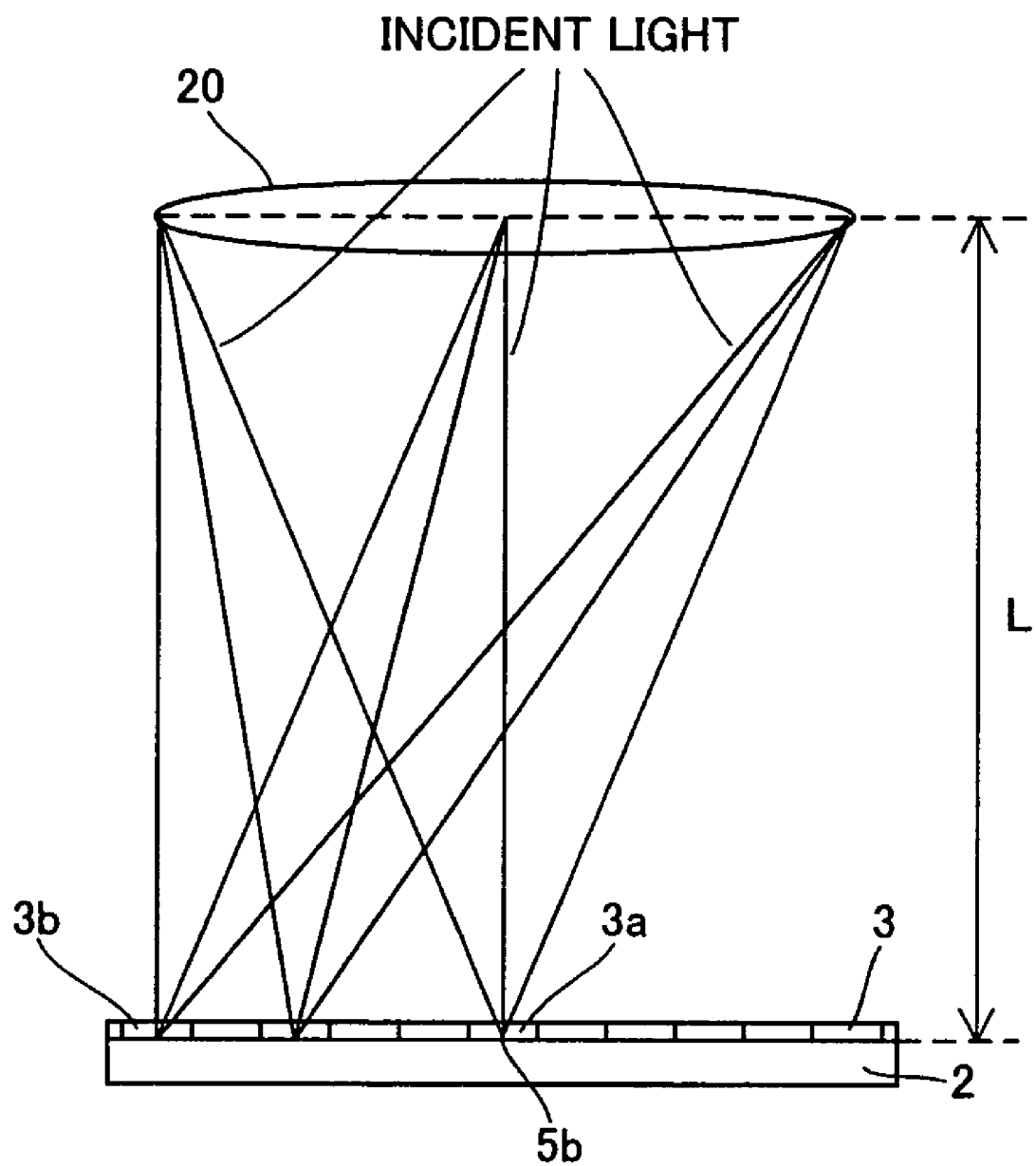
FIG. 5 is a model diagram showing the structure of an exit pupil in the solid-state imaging apparatus according to the first embodiment shown in FIG. 1.
Figure 6:
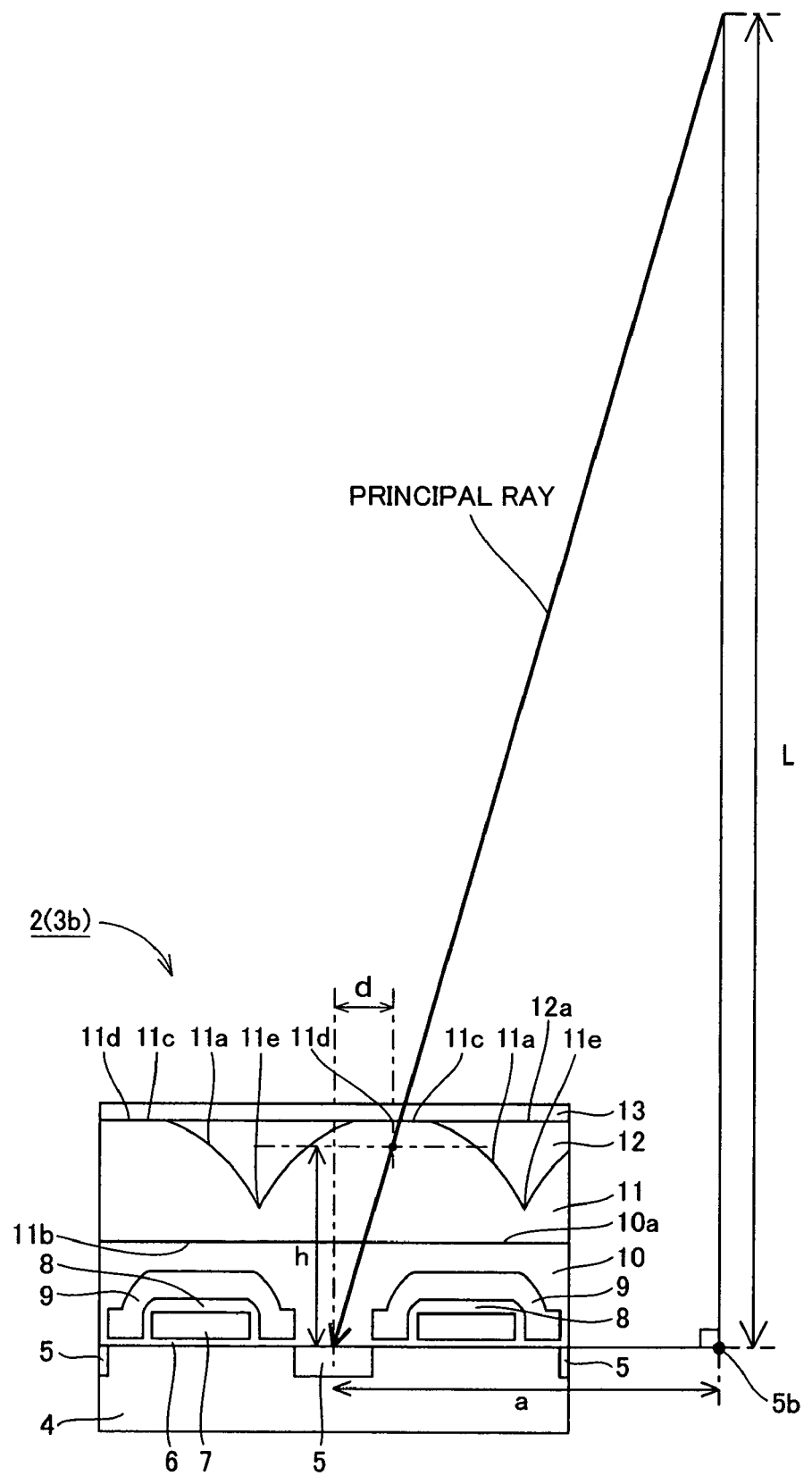
FIG. 6 is a model diagram for illustrating deviation of a lens in the solid-state imaging apparatus according to the first embodiment shown in FIG. 1.

According to the first embodiment, the deviation d (see FIG. 6) between the lens center 11d of each lens 11 and the center of the corresponding photodetection part 5 is set according to the following expression (1):

$$d = a \times h / L \tag{1}$$

where L represents the distance between the photodetection part 5 and an exit pupil 20 (see FIG. 5), h represents an arbitrary distance larger than the distance between the vertical position of the upper surface of the photodetection part 5 and the boundary 11e between each pair of adjacent lenses 11 and smaller than the distance between the vertical position of the upper surface of the photodetection part 5 and the vertical position of the lens center 11d of the lens 11, and a represents the distance between the center of an arbitrary photodetection part 5 in the photodetection region 5a and the center of the photodetection region 5a. The exit pupil 20 (see FIG. 5) is an image of the aperture stop 1c (see FIG. 1) formed by the optical lens 1b arranged closer to the solid-state image sensor 2 than the aperture stop 1c.

According to the first embodiment, the plurality of lenses 11 consist of a continuous layer. Thus, the adjacent lenses 11 are inhibited from forming clearances therebetween, whereby no uncondensed light results from clearances formed between the adjacent lenses 11 also when the lens centers 11d of the plurality of lenses 11 are arranged to remarkably deviate from the centers of the corresponding photodetection parts 5 in response to incident light remarkably inclined in the oblique direction, dissimilarly to a case of discontinuously arranging the plurality of lenses at prescribed intervals (clearances).

According to the first embodiment, as hereinabove described, the upper end surface portions 11c of the upper surface portions 11a of the lenses 11 formed between the semiconductor substrate 4 and the color filter layer 13 are so formed to be in contact with the lower surface of the color filter 13 that the distance between the upper end surface portions 11c of the upper surface portions 11a of the lenses 11 and the lower surface of the color filter 13 can be zeroed, whereby the vertical dimension of the solid-state image sensor 2 can be reduced. Thus, the solid-state imaging apparatus 60 having the lenses 11 provided between the semiconductor substrate 4 and the color filter layer 13 can be miniaturized.

According to the first embodiment, further, the upper surface portion 12a of the resin layer 12 is flatly formed to be flush with the upper end surface portions 11c of the upper surface portions 11a of the lenses 11 while the color filter layer 13 is formed on the upper end surface portions 11c of the upper surface portions 11a of the lenses 11 and the upper surface portion 12a of the resin layer 12 so that the color filter 13 can be formed on the flat surface formed by the upper end surface portions 11c of the upper surface portions 11a of the lenses 11 and the upper surface portion 12a of the resin layer 12. Thus, the color filter layer 13 can be easily formed on the lenses 11 having the upwardly projecting shape.

Figure 7:
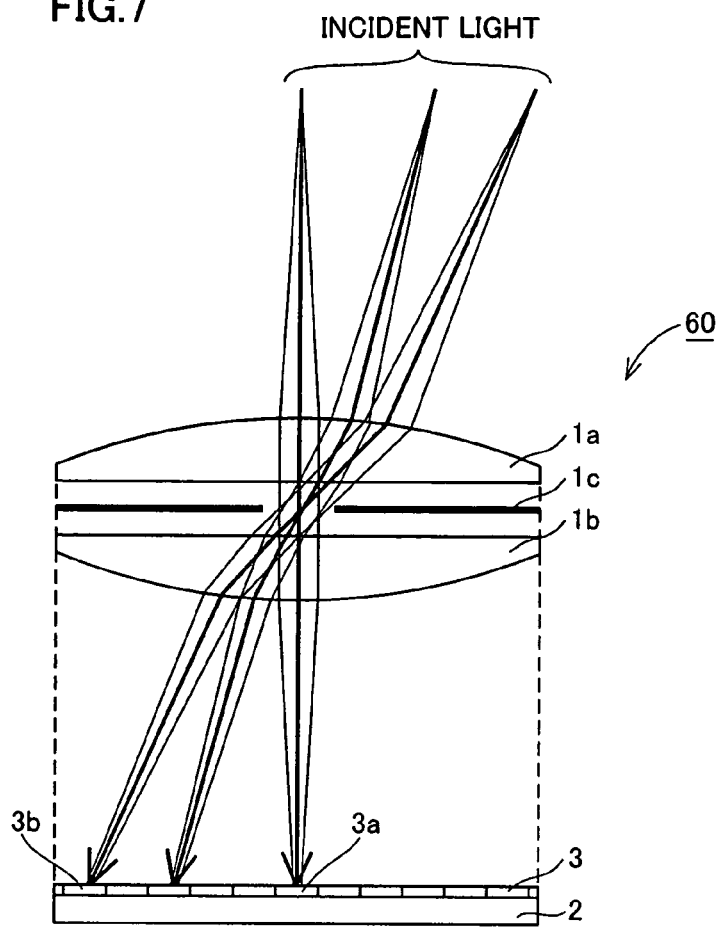
FIG. 7 is a model diagram showing an incidence path of light in the solid-state imaging apparatus according to the first embodiment shown in FIG. 1.
Figure 8:
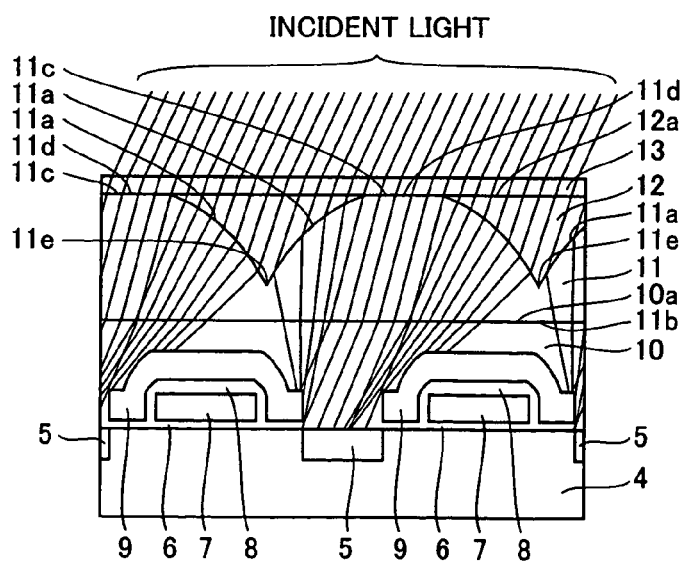
FIG. 8 is a sectional view showing an incidence path of light in a solid-state image sensor of the solid-state imaging apparatus according to the first embodiment shown in FIG. 1.
Figure 9:
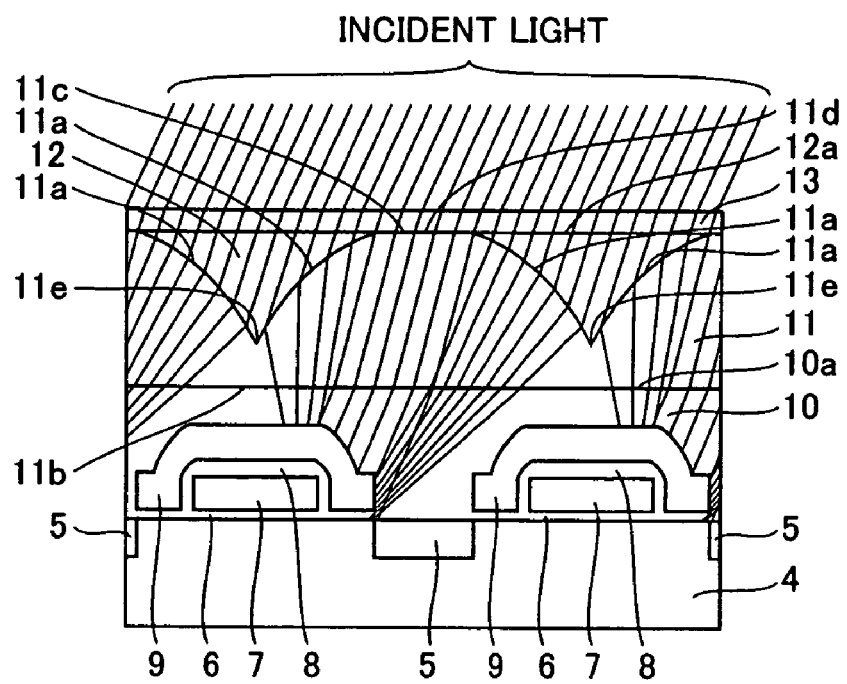
FIG. 9 is a sectional view showing comparative example for illustrating effects of the solid-state image sensor of the solid-state imaging apparatus according to the first embodiment shown in FIG. 1.

According to the first embodiment, in addition, the pixels 3 are so constituted that the deviation between the lens center 11d of each lens 11 and the center of the corresponding photodetection part 5 in the vicinity of each end of the photodetection region 5a is larger than the deviation between the lens center 11d of each lens 11 and the center of the corresponding photodetection part 5 in the vicinity of the central portion of the photodetection region 5a as hereinabove described, whereby the solid-state image sensor 2 can focus light obliquely incident upon each lens 11 on the corresponding photodetection part 5 as shown in FIG. 8 also when the same receives the obliquely incident light as shown in FIG. 7. Therefore, the solid-state image sensor 2 can efficiently condense light further obliquely incident in the vicinity of each end of the photodetection region 5a as compared with the vicinity of the central portion of the photodetection region 5a on the corresponding photodetection part 5 while condensing substantially perpendicular light on the photodetection part 5 in the vicinity of the central portion of the photodetection region 5a. Thus, the solid-state image sensor 2 can improve condensation efficiency on the photodetection parts 5 both in the vicinity of the central portion of the photodetection region 5a and in the vicinity of each end of the photodetection region 5a, whereby the solid-state imaging apparatus 60 having the lenses 11 provided between the semiconductor substrate 4 and the color filter layer 13 can be improved in photosensitivity. If the lens centers 11d of the lenses 11 are not in deviation from the centers of the photodetection parts 5 when oblique light is incident upon the solid-state image sensor 2, the solid-state image sensor 2 cannot focus the incident light on the photodetection parts 5 as shown in FIG. 9, and hence it is difficult to condense the obliquely incident light on the photodetection parts 5.

According to the first embodiment, the pixels 3 are so constituted that the deviation between the lens center 11d of each lens 11 and the center of the corresponding photodetection part 5 in the vicinity of each end of the photodetection region 5a is larger than the deviation between the lens center 11d of each lens 11 and the center of the corresponding photodetection part 5 in the vicinity of the central portion of the photodetection region 5a, whereby the solid-state image sensor 2 can effectively condense light having an incidence angle gradually increased from the vicinity of the center of the photodetection region 5a toward the vicinity of the ends of the photodetection region 5a along the direction of arrangement of the plurality of photodetection parts 5 on the photodetection parts 5 in response to the incidence angle. Thus, the solid-state image sensor 2 can improve condensation efficiency on the photodetection parts 5 over the entire photodetection region 5a including the vicinity of the center thereof and the vicinity of the ends thereof.

A fabrication process for the solid-state image sensor 2 according to the first embodiment of the present invention is described with reference to FIGS. 2 to 6 and 10 to 17.

Figure 10:
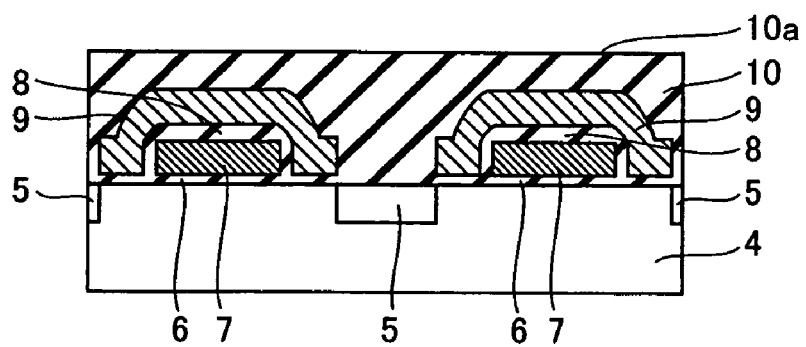
FIGS. 10 to 12 are sectional views for illustrating a fabrication process for the solid-state image sensor of the solid-state imaging apparatus according to the first embodiment of the present invention.

First, the transfer gates 7 of polysilicon are formed on prescribed regions of the surface of the semiconductor substrate 4 formed with the photodetection region 5a (see FIG. 3) consisting of the plurality of photodetection parts 5 through the insulator films 6, as shown in FIG. 10. The screen members 9 of a metallic material such as Al are formed to cover the upper portions of the transfer gates 7 through the insulator films 8. Thereafter the flattened layer 10 of silicon oxide is formed to cover the screen members 9. Then, the upper surface of the flattened layer 10 is flattened by CMP (chemical mechanical polishing). Thus, the flattened upper surface 10a of the flattened layer 10 is formed on the vertical position of about 100 nm to about 800 nm from the upper ends of the screen members 9.

Figure 11:
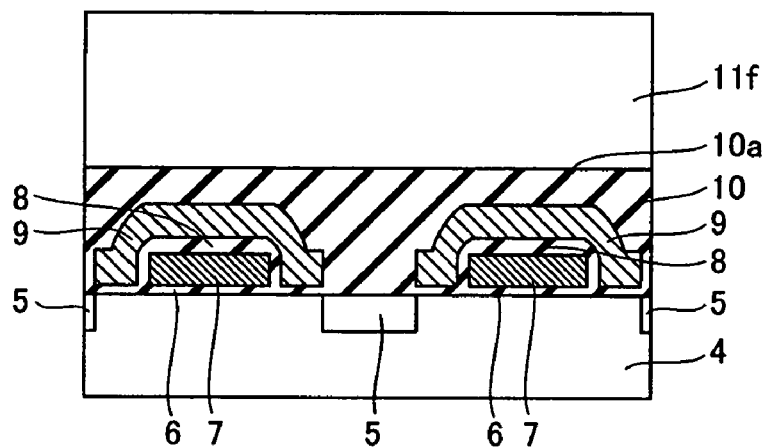

As shown in FIG. 11, an SiN film 11f having a thickness of about 500 nm to about 800 nm is formed on the upper surface 10a of the flattened layer 10 by CVD (chemical vapor deposition).

Figure 12:
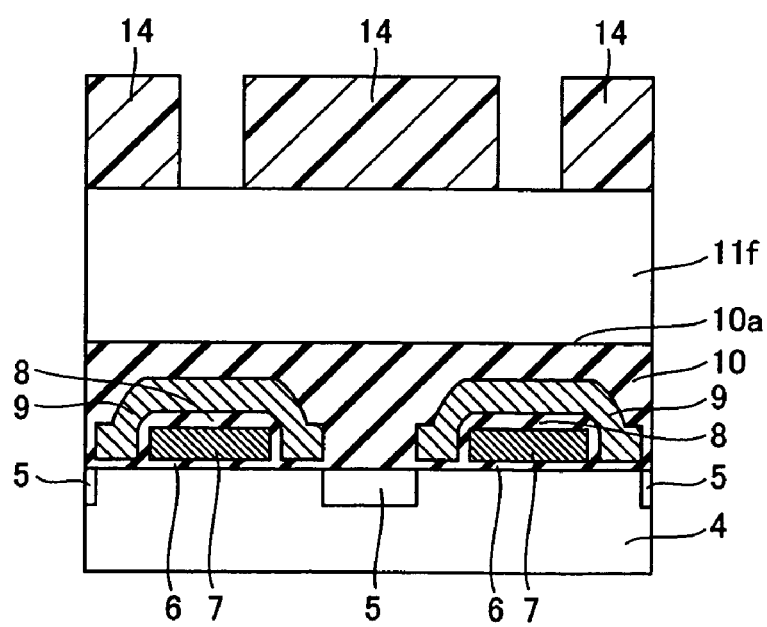
Figure 13:
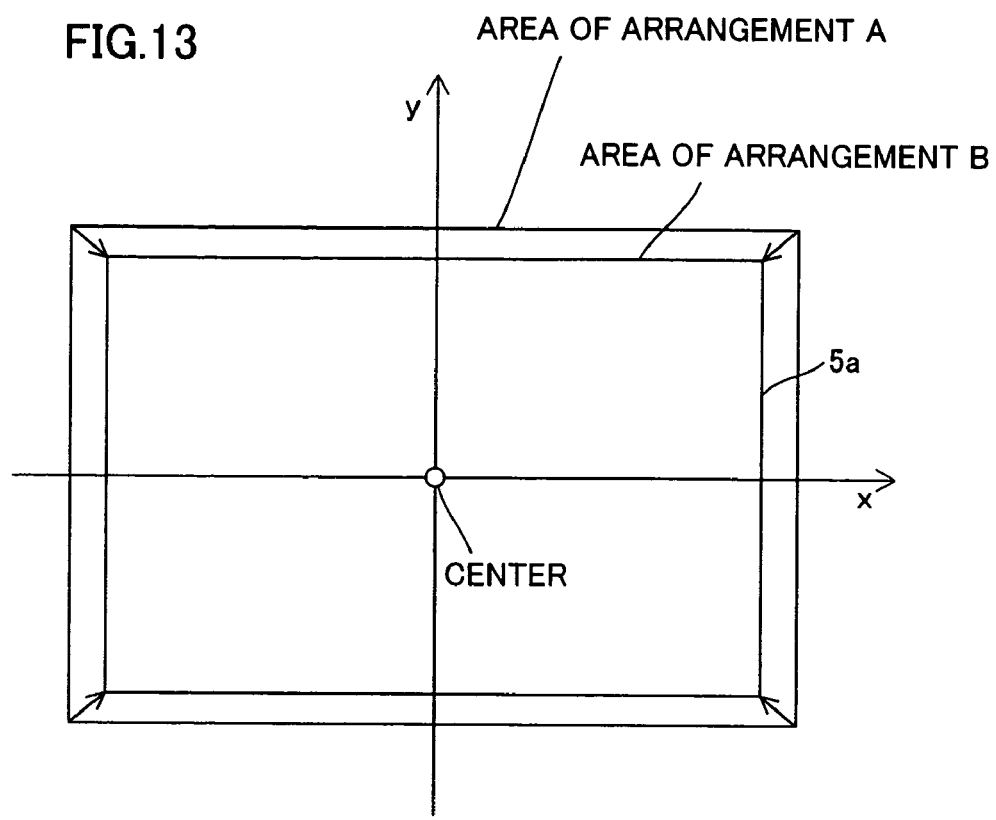
FIG. 13 is a model diagram for illustrating a process of forming lenses in a deviating manner in the solid-state imaging apparatus according to the first embodiment of the present invention.

As shown in FIG. 12, resist films 14 are formed on prescribed regions of the SiN film 11f by lithography. At this time, the resist films 14 are so patterned that the centers thereof coincide with the centers of the photodetection parts 5 at the central portion of the photodetection region 5a (see FIG. 3), as shown in FIG. 12. In the region (not shown) between the vicinity of the central portion of the photodetection region 5a (see FIG. 3) and the vicinity of each end thereof, on the other hand, the resist films 14 are so patterned that the deviation between the centers thereof and the centers of the photodetection parts 5 is gradually increased from the vicinity of the center of the photodetection region 5a toward the ends of the photodetection region 5a along the direction of arrangement of the plurality of photodetection parts 5. The deviation between the centers of the resist films 14 and those of the photodetection parts 5 is set to not more than 500 nm. At this time, the deviation between the centers of the resist films 14 and those of the photodetection parts 5 is set according to the above expression (1). More specifically, an area of arrangement A for matching the lens centers 11d (see FIG. 6) and the centers of the photodetection parts 5 with each other is set as shown in FIG. 13. The projection of each lens 11 in the set arrangement A is reduced at a prescribed ratio for inwardly deviating the lens center 11d by the deviation d (see FIG. 6) from the center of the corresponding photodetection part 5, thereby setting an area of arrangement B. At this time, it is assumed that the lens center 11d of a prescribed lens 11 in the arrangement A having the origin at the center of the area of the arrangement A has coordinates ($x_0$, $y_0$) and the distances L and h (see FIG. 6) in the above expression (1) are 12 mm and 3 μm respectively. In this case, the deviation d between the lens center 11d of the corresponding lens 11 in the arrangement B and the center of the corresponding photodetection part 5 obtained through the above expression (1) is ($-x_0 \times 3/12000$) in the x-axis direction and ($-y_0 \times 3/12000$) in the y-axis direction. Thus, the coordinates of the lens center 11d of each lens 11 in the arrangement B is set to ($x_0 - x_0 \times 3/12000$, $y_0 - y_0 \times 3/12000$). Thus, the resist films 14 for forming the lenses 11 to have the deviation d from the centers of the corresponding photodetection parts 5 can be patterned by setting the coordinates of the origin and the coordinates ($x_0 - x_0 \times 3/12000$, $y_0 - y_0 \times 3/12000$) of the centers of the resist films 14.

When the diagonal length of the photodetection region 5a (see FIG. 13) is set to about 3950 μm, for example, the diagonal position most separated from the center of the photodetection region 5a is at a distance of about 1975 μm from the center. Therefore, the deviation d between the lens center 11d of each lens 11 (see FIG. 6) on this diagonal position and the center of the corresponding photodetection part 5 is obtained as follows:

$$1975 \times 3/12000 = 0.494 \text{ μm}$$

When the diagonal length of the photodetection region 5a is set to about 3950 μm, therefore, the resist film 14 (see FIG. 12) corresponding to the lens center 11d of each lens 11 provided on the diagonal position is deviated toward the center of the photodetection region 5a (see FIG. 13) by about 0.494 μm, in order to deviate the lens center 11d toward the center of the photodetection region 5a by about 0.494 μm.

Figure 14:
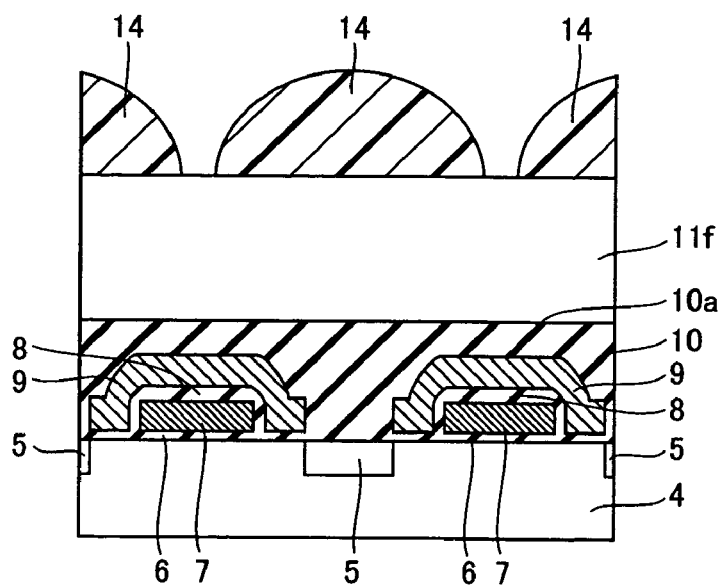
FIGS. 14 to 17 are sectional views for illustrating the fabrication process for the solid-state image sensor of the solid-state imaging apparatus according to the first embodiment of the present invention.

Then, heat treatment is performed on a hot plate at about 160° C. for about 2 minutes, thereby improving flowability of the resist films 14. Thus, the resist films 14 have upwardly projecting shapes due to surface tension, as shown in FIG. 14. At this time, adjacent pairs of the resist films 14 having the upwardly projecting shapes are provided at intervals of about 0.2 μm.

Figure 15:
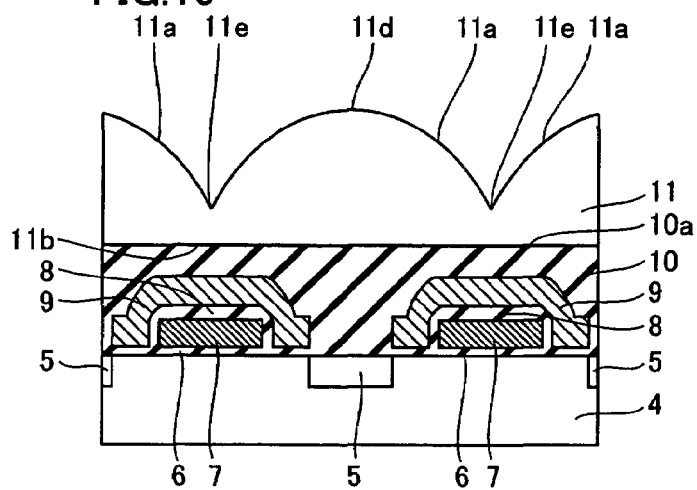

Then, the resist films 14 having the upwardly projecting shapes and the SiN film 11f are simultaneously etched thereby forming the plurality of lenses 11 having the upwardly projecting upper surface portions 11a reflecting the upwardly projecting shapes of the resist films 14, as shown in FIG. 15. The plurality of lenses 11 are prepared from the continuous layer. Specific etching conditions for this step are $CF_4$ gas of about 5 sccm to about 25 sccm, $O_2$ gas of about 5 sccm to 30 sccm and Ar gas of about 50 sccm to about 150 sccm, RF power of about 500 W to about 1000 W and gas pressure of about 2.6 Pa to about 10.7 Pa. Thus, the lens centers 11d of the lenses 11 coincide with the centers of the corresponding photodetection parts 5 at the center of the photodetection region 5a (see FIG. 3), as shown in FIG. 15. In the region (not shown) between the vicinity of the central portion of the photodetection region 5a and the vicinity of each end thereof, on the other hand, the deviation between the lens centers 11d of the lenses 11 and the centers of the corresponding photodetection parts 5 is gradually increased from the vicinity of the center of the photodetection region 5a toward the vicinity of each end of the photodetection region 5a along the direction of arrangement of the plurality of photodetection parts 5.

Figure 16:
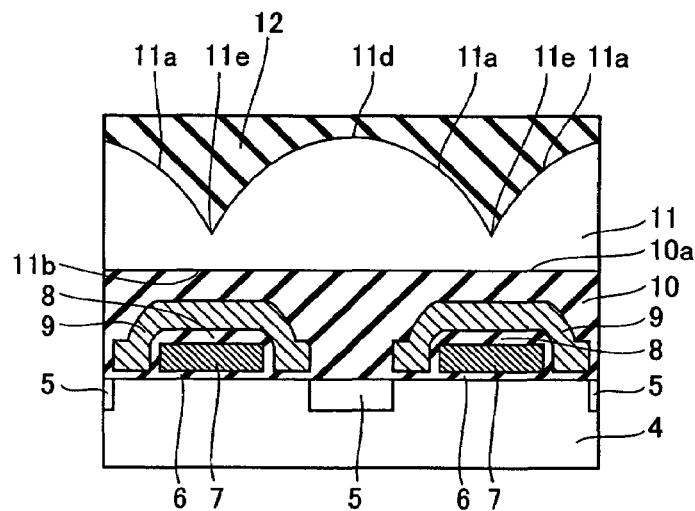

As shown in FIG. 16, the resin layer 12 of acrylic resin is formed by spin coating to fill up the boundaries 11e between the projections of the adjacent pairs of the lenses 11 while covering the upper surface portions 11a of the lenses 11. According to this spin coating, acrylic resin is applied to the lenses 11 and the solid-state image sensor 2 is thereafter rotated about a vertical axis for spreading the acrylic resin on the overall surfaces of the lenses 11. At this time, the solid-state image sensor 2 is set to a rotational frequency for forming a film of the acrylic resin having a thickness of about 500 nm to about 1500 nm on a flat substrate when applying the acrylic resin onto the substrate and rotating the same.

Figure 17:
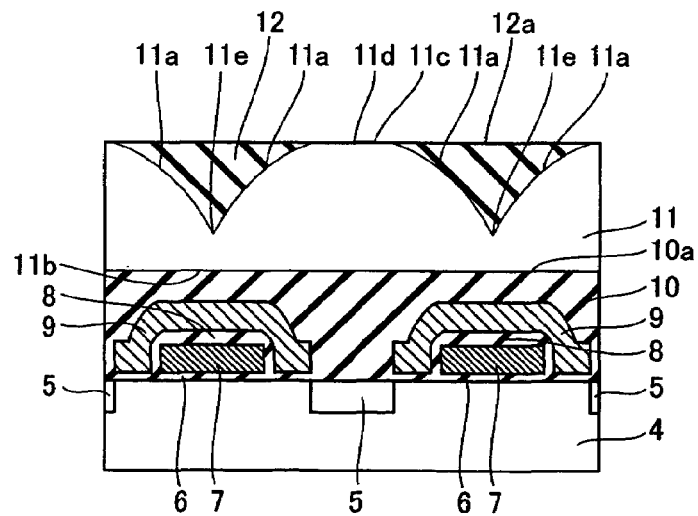

Then, the upper surface of the resin layer 12 is polished by CMP to partially expose the lenses 11. Thus, the flattened upper end surface portions 11c of the upper surface portions 11a of the lenses 11 and the flattened upper surface portion 12a of the resin layer 12 are flush with each other as shown in FIG. 17. Thereafter the color filter layer 13 having the thickness of about 300 nm to about 1000 nm is formed between the upper end surface portions 11c of the upper surface portions 11a of the lenses 11 and the upper surface portion 12a of the resin layer 12. The color filter layer 13 is formed by performing exposure and development with the photosensitive resin material containing the pigments of three colors of R, G and B. Thus, the solid-state image sensor 2 of the solid-state imaging apparatus 60 according to the first embodiment is formed as shown in FIGS. 2 and 4.

(Second Embodiment)

A second embodiment of the present invention is applied to a solid-state image sensor 22 of a frame transfer CCD, dissimilarly to the aforementioned first embodiment.

Figure 18:
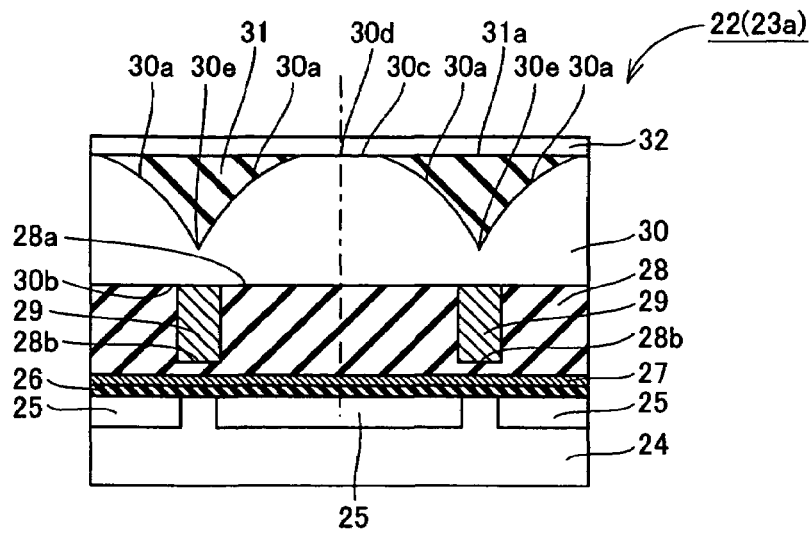
FIG. 18 is a sectional view showing the structure of a pixel portion at the center of a photodetection region of a solid-state image sensor according to a second embodiment of the present invention.

In the solid-state image sensor 22 according to the second embodiment, a plurality of photodetection parts 25 having a photoelectric conversion function of converting incident light to charge signals are formed on prescribed regions of the surface of a semiconductor substrate 24, as shown in FIG. 18. The semiconductor substrate 24 is an example of the "substrate" in the present invention. The plurality of photodetection parts 25 form a photodetection region 5a (see FIG. 3), similarly to the aforementioned first embodiment. The plurality of photodetection parts 25 are arranged at intervals of about 0.3 μm to about 3 μm respectively. A transfer gate 27 of polysilicon is formed on the semiconductor substrate 24 having the photodetection parts 25 through an insulator film 26. A flattened layer 28 is formed to cover the transfer gate 27. This flattened layer 28 is formed by a silicon oxide film having excellent coverage and light transmissivity.

According to the second embodiment, screen members 29 of W or the like are formed to fill up grooves 28b formed in the flattened layer 28. Thus, the side and bottom surfaces of the screen members 29a are covered with the flattened layer 28. The upper ends of the screen members 29 and the upper surface of the flattened layer 28 are flush with each other. Thus, the upper ends of the screen members 29 and the upper surface of the flattened layer 28 form a flat surface 28a. A plurality of lenses 30 similar in structure to the lenses 11 (see FIGS. 2 and 4) according to the aforementioned first embodiment are formed on the flat surface 28a. The plurality of lenses 30 consist of a continuous layer. Upwardly projecting upper surface portions 30a of the lenses 30 include flattened upper end surface portions 30c. A resin layer 31 of acrylic resin is formed to fill up boundaries 30e between the projections of the adjacent pairs of the lenses 30 while covering regions of the upper surface portions 30a of the lenses 30 other than the upper end surface portions 30c. This resin layer 31 has a flattened upper surface portion 31a flush with the upper end surface portions 30c of the lenses 30. A color filter layer 32 is formed on a flat surface consisting of the upper surface portion 31a of the resin layer 31 and the upper end surface portions 30c of the lenses 30. Thus, the upper end surface portions 30c of the upper surface portions 30a of the lenses 30 are in contact with the lower surface of the color filter layer 32.

Figure 19:
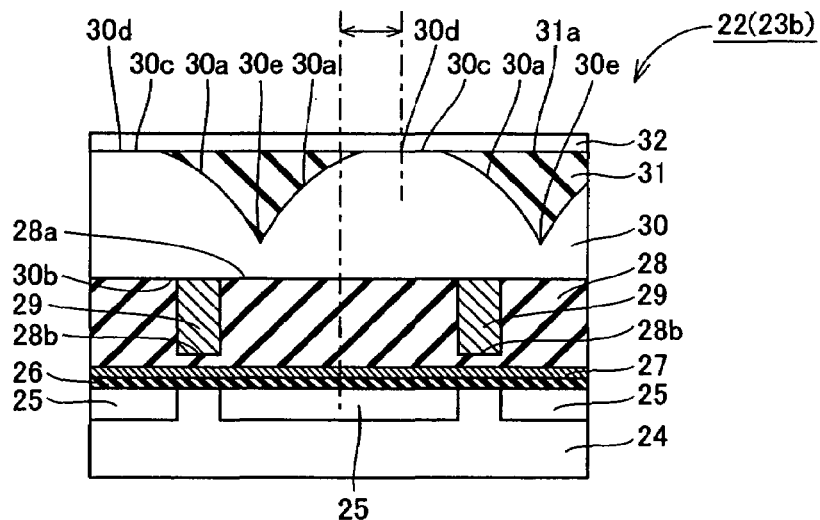
FIG. 19 is a sectional view showing the structure of another pixel portion in the vicinity of an end of the photodetection region of the solid-state image sensor according to the second embodiment of the present invention.

According to the second embodiment, each pixel 23a located at the center of the photodetection region 5a (see FIG. 3) is so arranged that a lens center 30d of the corresponding lens 30 coincides with the center of the corresponding photodetection part 25 as shown in FIG. 18. On the other hand, each pixel 23b located in the vicinity of each end of the photodetection region 5a (see FIG. 3) is so arranged that the lens center 30d of the corresponding lens 30 deviates from the center of the corresponding photodetection part 25 by a prescribed distance, as shown in FIG. 19. The deviation between the lens centers 30d of the lenses 30 and the centers of the corresponding photodetection parts 25 is gradually increased from the vicinity of the central portion of the photodetection region 5a (see FIG. 3) toward the vicinity of the ends of the photodetection region 5a along the direction of arrangement of the plurality of photodetection parts 25. This deviation is set to reach the value d obtained through the above expression (1). In all areas of the photodetection region 5a (see FIG. 3), the deviation between the lens centers 30d of the lenses 30 and the centers of the corresponding photodetection parts 25 is set to not more than about 500 nm. The remaining structure of the solid-state image sensor 22 according to the second embodiment is similar to that of the solid-state image sensor 2 according to the aforementioned first embodiment.

According to the second embodiment, as hereinabove described, the upper end surface portions 30c of the upper surface portions 30a of the lenses 30 formed between the semiconductor substrate 24 and the color filter layer 32 are in contact with the lower surface of the color filter layer 32 so that the distance between the upper end surface portions 30c of the upper surface portions 30a of the lenses 30 and the lower surface of the color filter layer 32 can be zeroed, whereby the vertical dimension of the solid-state image sensor 22 can be reduced. Thus, a solid-state imaging apparatus having the lenses 30 provided between the semiconductor substrate 24 and the color filter layer 32 can be miniaturized.

According to the second embodiment, the deviation between the lens center 30d of each lens 30 and the center of the corresponding photodetection part 25 in the vicinity of each end of the photodetection region 5a is larger than the deviation between the lens center 30d of each lens 30 and the center of the corresponding photodetection part 5 in the vicinity of the central portion of the photodetection region 5a, whereby the solid-state image sensor 22 can efficiently condense light further obliquely incident in the vicinity of each end of the photodetection region 5a as compared with the vicinity of the central portion of the photodetection region 5a on the photodetection part 25 while condensing substantially perpendicular light on the photodetection part 25 in the vicinity of the central portion of the photodetection region 5a. Thus, the solid-state image sensor 22 can improve condensation efficiency on the photodetection parts 25 both in the vicinity of the central portion of the photodetection region 5a and in the vicinity of each end of the photodetection region 5a, whereby the solid-state imaging apparatus having the lenses 30 provided between the semiconductor substrate 24 and the color filter layer 32 can be improved in photosensitivity.

The remaining effects of the second embodiment are similar to those of the aforementioned first embodiment.

A fabrication process for the solid-state image sensor 22 according to the second embodiment of the present invention is described with reference to FIGS. 18 to 23.

Figure 20:
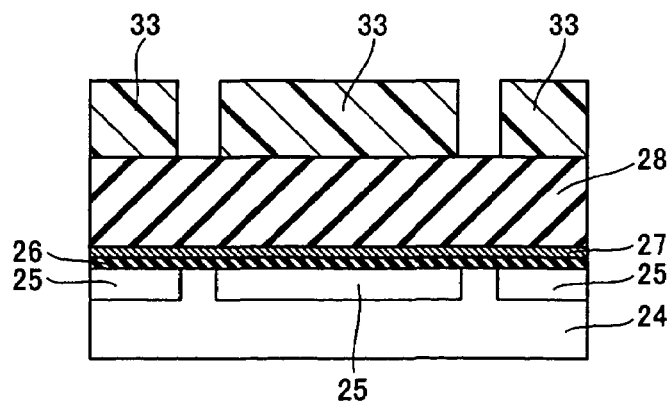
FIGS. 20 to 23 are sectional views for illustrating a fabrication process for the solid-state image sensor according to the second embodiment of the present invention.

According to the second embodiment, the insulator film 26 and the transfer gate 27 of polysilicon are formed in this order to cover the upper surface of the semiconductor substrate 24 formed with the photodetection region 5a (see FIG. 3) consisting of the plurality of photodetection parts 25, as shown in FIG. 20. The flattened layer 28 of silicon oxide is formed to cover the transfer gate 27, and the upper surface thereof is thereafter flattened by CMP. Resist films 33 are formed on prescribed regions of the flattened upper surface of the flattened layer 28.

Figure 21:
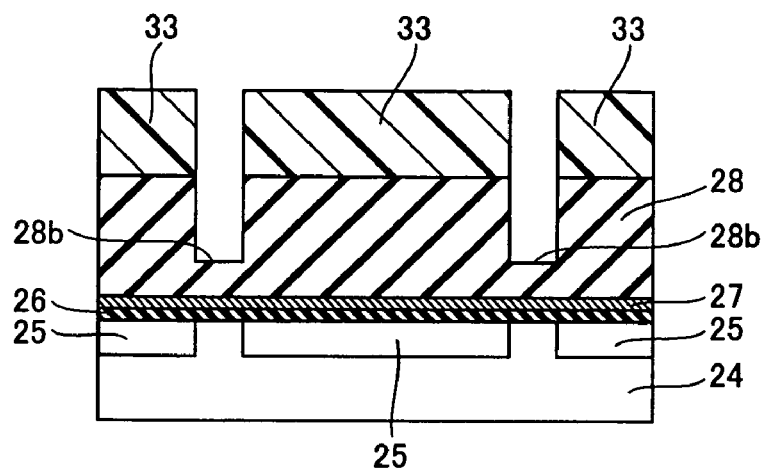

As shown in FIG. 21, the resist films 33 are employed as masks for etching the flattened layer 28 by a prescribed depth, thereby forming the grooves 28b. Thereafter the resist films 33 are removed from the flattened layer 28.

Figure 22:
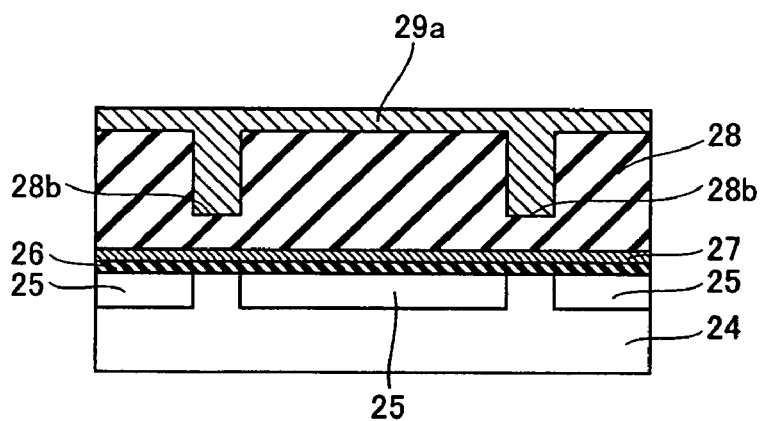
Figure 23:
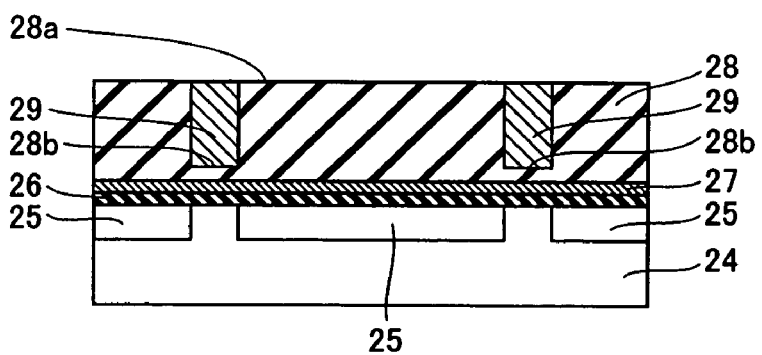

As shown in FIG. 22, a metal layer 29a of W or the like is formed to fill up the grooves 28b of the flattened layer 28 while extending on the upper surface of the flattened layer 28. Excess portions of the metal layer 29a are polished off by CMP, thereby forming the screen members 29 of W or the like and rendering the upper ends of the screen members 29 flush with the upper surface of the flattened layer 28 as shown in FIG. 23. Thus, the flat surface 28a is constituted of the upper ends of the screen members 29 and the upper surface of the flattened layer 28. Thereafter the lenses 30, the resin layer 31 and the color filter layer 32 are formed on the flat surface 28a through a process similar to that in the aforementioned first embodiment, as shown in FIGS. 18 and 19. Thus, the solid-state image sensor 22 according to the second embodiment is formed as shown in FIGS. 18 and 19.

(Third Embodiment)

In a solid-state image sensor 42 of an interline CCD according to a third embodiment of the present invention, no flat upper end surface portions are formed on upwardly projecting upper surfaces portions of lenses 51 dissimilarly to the aforementioned first embodiment. The structure of the solid-state image sensor 42 according to the third embodiment of the present invention is described with reference to FIGS. 24 and 25.

Figure 24:
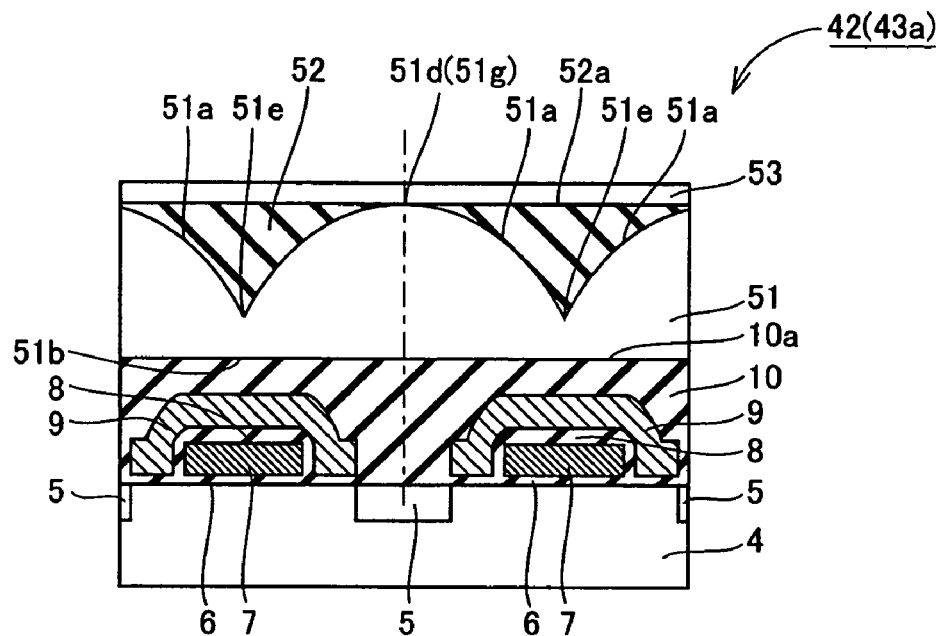
FIG. 24 is a sectional view showing the structure of a pixel portion at the center of a photodetection region of a solid-state image sensor according to a third embodiment of the present invention.

In the solid-state image sensor 42 according to the third embodiment, a plurality of lenses 51 are formed on an upper surface 10a of a flattened layer 10 for condensing light on photodetection parts 5, as shown in FIG. 24. The plurality of lenses 51 consist of a continuous layer. The lenses 51 have upwardly projecting upper surface portions 51a and flat lower surface portions 51b coming into contact with the upper surface 10a of the flattened layer 10. Apices 51g of the upper surface portions 51a are not flattened dissimilarly to the aforementioned first and second embodiments. The lenses 51 have a thickness of about 500 nm to about 800 nm at lens centers 51d and a thickness of about 50 nm to about 200 nm on boundaries 51e between the projections of the adjacent pairs of the lenses 51. A resin layer 52 of acrylic resin is formed to fill up the boundaries 51e between the lenses 51 while covering regions of the upper surface portions 51a of the lenses 51 other than the apices 51g. This resin layer 52 has a flattened upper surface portion 52a flush with the apices 51g of the lenses 51. The flat upper surface portion 52a of the resin layer 52 and the apices 51g of the lenses 51 form a flat surface. A color filter layer 53 having a thickness of about 300 nm to about 1000 nm is formed on the flat surface formed by the upper surface portion 52a of the resin layer 52 and the apices 51g of the lenses 51. Thus, the apices 51g of the upper surface portions 51a of the lenses 51 are in contact with the lower surface of the color filter layer 53. According to the third embodiment, the lenses 51 are arranged between the color filter layer 53 and a semiconductor substrate 4 in the aforementioned manner.

Figure 25:
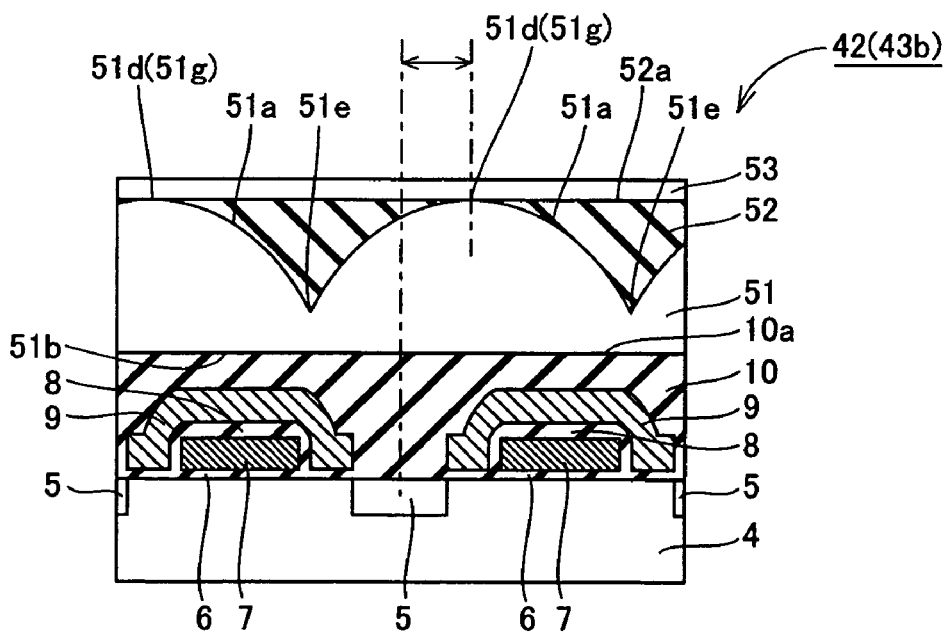
FIG. 25 is a sectional view showing the structure of another pixel portion in the vicinity of an end of the photodetection region of the solid-state image sensor according to the third embodiment of the present invention.

According to the third embodiment, further, each pixel 43a located at the center the photodetection region 5a (see FIG. 3) is so arranged that the lens center 51d of the corresponding lens 51 and the center of the corresponding photodetection part 5 coincide with each other, as shown in FIG. 24. On the other hand, each pixel 43b located in the vicinity of each end of the photodetection region 5a (see FIG. 3) is so arranged that the lens center 51d of the corresponding lens 51 deviates from the center of the corresponding photodetection part 5 by a prescribed distance, as shown in FIG. 25. The deviation between the lens centers 51d of the lenses 51 and the centers of the photodetection parts 5 is gradually increased from the vicinity of the central portion of the photodetection region 5a (see FIG. 3) toward the vicinity of the ends of the photodetection region 5a (see FIG. 3) along the direction of arrangement of the plurality of photodetection parts 5. The remaining structure of the solid-state image sensor 42 according to the third embodiment is similar to that of the solid-state image sensor 2 according to the aforementioned first embodiment.

According to the third embodiment, as hereinabove described, the apices 51g of the upper surface portions 51a of the lenses 51 formed between the semiconductor substrate 4 and the color filter layer 53 come into contact with the lower surface of the color filter layer 53 so that the distance between the apices 51g of the upper surface portions 51a of the lenses 51 and the lower surface of the color filter layer 53 can be zeroed, whereby the vertical dimension of the solid-state image sensor 42 can be reduced. Thus, a solid-state imaging apparatus having the lenses 51 provided between the semiconductor substrate 4 and the color filter layer 53 can be miniaturized.

The remaining effects of the third embodiment are similar to those of the aforementioned first embodiment.

Figure 26:
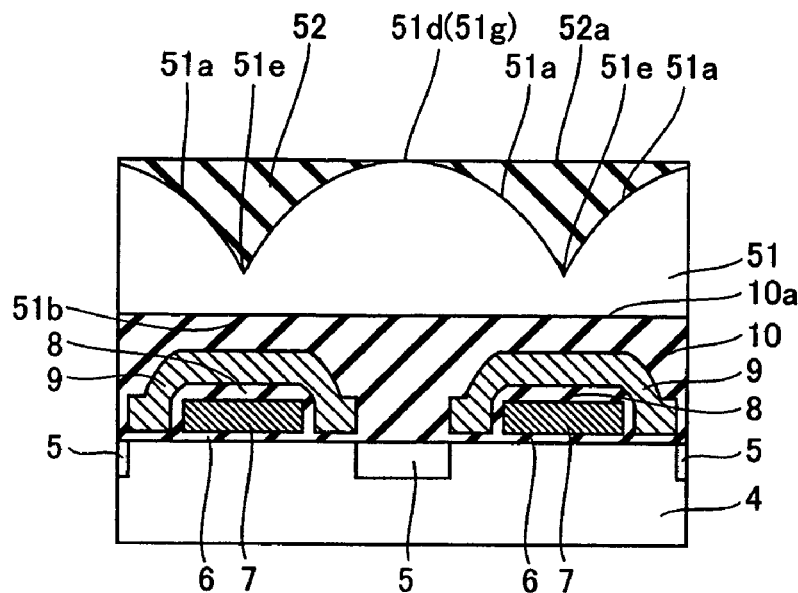
FIG. 26 is a sectional view for illustrating a fabrication process for the solid-state image sensor according to the third embodiment of the present invention.
Figure 27:
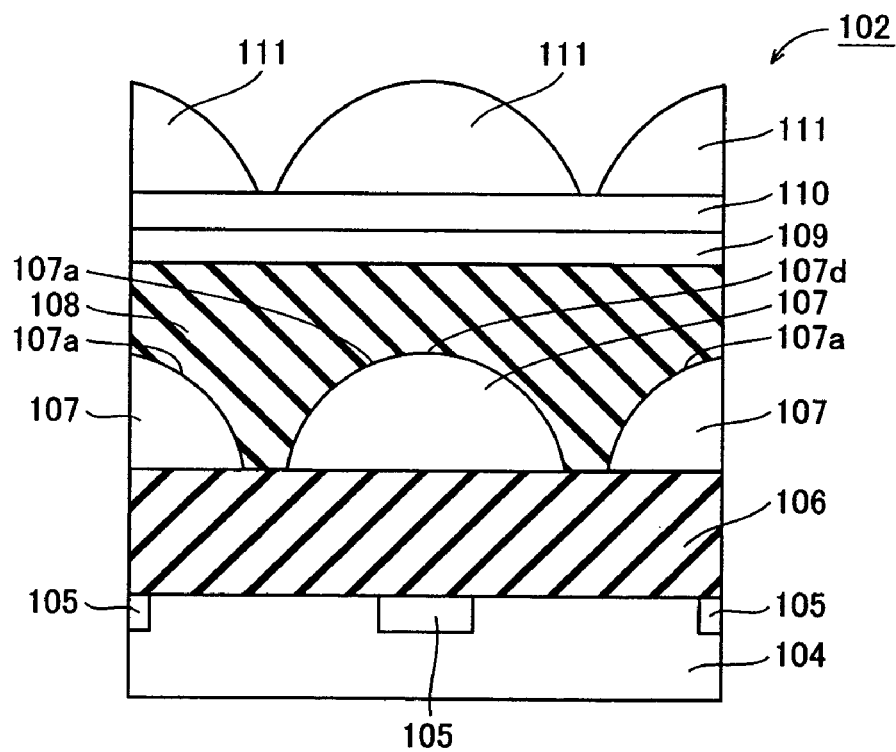
FIG. 27 is a sectional view showing the structure of a conventional solid-state imaging apparatus comprising lenses for condensing light on photodetection parts.

A fabrication process for the solid-state image sensor 42 according to the third embodiment of the present invention is described with reference to FIGS. 24 to 26.

According to the third embodiment, the plurality of lenses 51 having the upwardly projecting upper surface portions 51a and lower portions of the lenses 51 are formed through steps similar to those of the aforementioned first embodiment shown in FIGS. 10 to 15. Thereafter the resin layer 52 of acrylic resin is formed by spin coating to fill up the boundaries 51e between the projections of the adjacent pairs of the lenses 51 while covering the regions of the upper surface portions 51a of the lenses 51 other than the apices 51g, as shown in FIG. 26. Thereafter the flattened upper surface portion 52a of the resin layer 52 is formed to be flush with the apices 51g of the upper surface portions 51 of the lenses 51 by regulating the rotational frequency for spin coating. Thereafter the color filter layer 53 having the thickness of about 300 nm to about 1000 nm is formed on the apices 51g of the upper surface portions 51a of the lenses 51 and the upper surface portion 52a of the resin layer 52. Thus, the solid-state image sensor 42 according to the third embodiment is formed as shown in FIGS. 24 and 25.

Although the present invention has been described and illustrated in detail, it is clearly understood that the same is by way of illustration and example only and is not to be taken by way of limitation, the spirit and scope of the present invention being limited only by the terms of the appended claims.

For example, while the apices 51g of the upper surface portions 51a of the lenses 51 are in contact with the lower surface of the color filter layer 53 in the solid-state image sensor 42 of the interline CD according to the aforementioned third embodiment, the present invention is not restricted to this but apices of upper surface portions of lenses may alternatively come into contact with the lower surface of a color filter layer in a solid-state image sensor of another type such as that of a frame transfer CCD.

While the apices 51g of the upper surface portions 51a of the plurality of lenses 51 are entirely in contact with the lower surface of the color filter layer 53 in the aforementioned third embodiment, the present invention is not restricted to this but only the apices 51g of the upper surface portions 51a of arbitrary lenses 51 selected from the plurality of lenses 51 may alternatively be in contact with the lower surface of the color filter layer 53 while the apices 51g of the upper surface portions 51a of the remaining lenses 51 may not be in contact with the lower surface of the color filter layer 53.

While the upper surface of the flattened layer or the insulator film is flattened by CMP in each of the aforementioned embodiments, the present invention is not restricted to this but the upper surface of the flattened layer or the insulator film may alternatively be flattened by etching.

While the flattened layer or the insulator film consists of a silicon oxide film in each of the aforementioned embodiments, the present invention is not restricted to this but the flattened layer or the insulator film may alternatively consist of a silicon nitride film.

While the solid-state image sensor according to each of the aforementioned embodiments is provided with only the lenses (inner lenses) formed between the color filter layer and the semiconductor substrate as the lenses for condensing light on the photodetection parts, the present invention is not restricted to this but a plurality of microlenses having projecting portions corresponding to the photodetection parts respectively may further be provided on the color filter layer in addition to the lenses (inner lenses) formed between the color filter layer and the semiconductor substrate.

While the resin layer is prepared from acrylic resin for covering the upper surface portions of the lenses in each of the aforementioned embodiments, the present invention is not restricted to this but the resin layer may alternatively be prepared from a resin material other than acrylic resin for covering the upper surface portions of the lenses.

While CMP is employed for flattening the upper surface of the resin layer and forming the flat upper end surface portions on the upper surface portions of the lenses in each of the aforementioned first and second embodiments, the present invention is not restricted to this but etching may alternatively be employed for flattening the upper surface of the resin layer and forming the flat upper end surface portions on the upper surface portions of the lenses.

While the present invention is applied to a CCD in each of the aforementioned embodiments, the present invention is not restricted to this but may alternatively be applied to another solid-state imaging apparatus such as a CMOS sensor. Also when the present invention is applied to another solid-state imaging apparatus such as a CMOS sensor, effects such as miniaturization of the solid-state imaging apparatus can be attained similarly to the aforementioned embodiments.

While the plurality of lenses consist of a continuous layer in each of the aforementioned embodiments, the present invention is not restricted to this but the plurality of lenses may alternatively include portions consisting of a continuous layer and other portions consisting of other layers.

While the screen members 9 and 29 are made of the materials containing Al and W respectively in the aforementioned first and second embodiments, the present invention is not restricted to this but the screen members 9 or 29 may be made of a material containing either Al or W.

What is claimed is:

1. A solid-state imaging apparatus comprising:
    a photodetection part formed on a substrate;
    a color filter layer formed on said substrate;
    a lens formed between said substrate and said color filter layer for condensing light on said photodetection part; and
    a resin layer, formed to cover a region of said upper surface portion of said lens other than the upper end, having a substantially flat upper surface portion substantially flush with the upper end of said upper surface portion of said lens, wherein
    said lens has an upwardly projecting upper surface portion, while the upper end of said upper surface portion substantially comes into contact with the lower surface of said color filter layer; and
    said color filter layer is formed on the upper end of said upper surface portion of said lens and said upper surface portion of said resin layer.

2. The solid-state imaging apparatus according to claim 1, wherein said resin layer consists of a material containing acrylic resin.

3. The solid-state imaging apparatus according to claim 1, wherein said color filter layer consists of a resin material.

4. The solid-state imaging apparatus according to claim 1, wherein
    said upper surface portion of said lens includes an upper end having no substantially flat portion, and
    said upper end of said upper surface portion substantially comes into contact with the lower surface of said color filter layer.

5. The solid-state imaging apparatus according to claim 1, further comprising a screen member formed on a region between two adjacent said photodetection parts and between said substrate and said lens, wherein
the lower end of said lens is arranged above the upper end of said screen member.

6. The solid-state imaging apparatus according to claim 5, wherein said screen member consists of a material containing Al.

7. The solid-state imaging apparatus according to claim 5, wherein said screen member consists of a material containing W.

8. The solid-state imaging apparatus according to claim 5, further comprising a transfer gate for transferring a charge signal obtained in said photodetection part, wherein
said screen member is provided to cover the upper portion of said transfer gate.

9. The solid-state imaging apparatus according to claim 1, provided with a plurality of said lenses, wherein
said plurality of lenses include portions consisting of a continuous layer.

10. The solid-state imaging apparatus according to claim 1, wherein
said lens consists of a material containing SiN.

11. The solid-state imaging apparatus according to claim 1, further comprising an optical lens provided on said color filter layer.

12. A solid-state imaging apparatus comprising:
a photodetection part formed on a substrate;
a color filter layer formed on said substrate; and
a lens formed between said substrate and said color filter layer for condensing light on said photodetection part, wherein
said lens has an upwardly projecting upper surface portion, while the upper end of said upper surface portion substantially comes into contact with the lower surface of said color filter layer, and
the upper end of said upper surface portion of said lens includes a substantially flat upper end surface portion substantially coming into contact with the lower surface of said color filter layer.

13. A solid-state imaging apparatus comprising:
a photodetection part formed on a substrate;
a color filter layer formed on said substrate; and
a lens formed between said substrate and said color filter layer for condensing light on said photodetection part, wherein
said lens has an upwardly projecting upper surface portion, while the upper end of said upper surface portion substantially comes into contact with the lower surface of said color filter layer, and
the lens center of said lens is arranged to deviate from the center of said photodetection part by a prescribed distance.

14. A solid-state imaging apparatus comprising:
a photodetection part formed on a substrate;
a color filter layer formed on said substrate;
a lens formed between said substrate and said color filter layer for condensing light on said photodetection part;
a screen member formed on a region between two adjacent said photodetection parts and between said substrate and said lens, and
a flattened layer having a substantially flat upper surface at least flush with the upper end of said screen member, wherein
said lens has an upwardly projecting upper surface portion, while the upper end of said upper surface portion substantially comes into contact with the lower surface of said color filter layer,
the lower end of said lens is arranged above the upper end of said screen member, and
said lens is formed on the upper surface of said flattened layer.

15. The solid-state imaging apparatus according to claim 14, wherein said flattened layer is formed to cover said screen member.

16. The solid-state imaging apparatus according to claim 14, wherein
said flattened layer is formed to cover the side surfaces and the lower surface of said screen member, and
the upper end of said screen member and the upper surface of said flattened layer are substantially flush with each other.

17. A solid-state imaging apparatus comprising:
a photodetection part formed on a substrate;
a color filter layer formed on said substrate;
a lens formed between said substrate and said color filter layer for condensing light on said photodetection part; and
a photodetection region formed on said substrate by a plurality of said photodetection parts, wherein
said lens has an upwardly projecting upper surface portion, while the upper end of said upper surface portion substantially comes into contact with the lower surface of said color filter layer,
a plurality of said lenses are provided in correspondence to said plurality of photodetection parts respectively, and
deviations between the lens center of said lens located in the vicinity of an end of said photodetection region and the center of corresponding said photodetection part is larger than deviation between the lens center of said lens located in the vicinity of the center of said photodetection region and the center of corresponding said photodetection part.

18. A solid-state imaging apparatus comprising:
a photodetection part formed on a substrate;
a color filter layer formed on said substrate;
a lens formed between said substrate and said color filter layer for condensing light on said photodetection part, and
a photodetection region formed on said substrate by a plurality of said photodetection parts, wherein
said lens has an upwardly projecting upper surface portion, while the upper end of said upper surface portion substantially comes into contact with the lower surface of said color filter layer; and
deviation between the lens center of said lens and the center of corresponding said photodetection part is gradually increased from the vicinity of the center of said photodetection region toward an end of said photodetection region along the direction of arrangement of said plurality of photodetection parts.

19. The solid-state imaging apparatus according to claim 18, wherein
deviation between the lens center of said lens and the center of corresponding said photodetection part is expressed as follows:

$$a \times h / L$$

assuming that L represents the distance between said photodetection parts and an exit pupil, h represents an arbitrary distance larger than the distance between the vertical position of the upper surfaces of said photodetection parts and the vertical position of the boundary between two adjacent said lenses and smaller than the distance between the vertical position of the upper surfaces of said photodetection parts and the vertical position of the lens center of said lens and a represents the distance between the center of arbitrary said photodetection part in said photodetection region and the center of said photodetection region.

* * * * *